(12) United States Patent
Uchida

(10) Patent No.: US 7,521,935 B2
(45) Date of Patent: Apr. 21, 2009

(54) POWERTRAIN BATTERY LIFE PREDICTING AND WARNING APPARATUSES

(75) Inventor: Masatoshi Uchida, Toyota (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 471 days.

(21) Appl. No.: 11/496,434

(22) Filed: Aug. 1, 2006

(65) Prior Publication Data

US 2007/0029974 A1   Feb. 8, 2007

(30) Foreign Application Priority Data

Aug. 8, 2005 (JP) ............................. 2005-229094
Mar. 17, 2006 (JP) ............................. 2006-074228

(51) Int. Cl.
*G01N 27/416* (2006.01)

(52) U.S. Cl. .................................................. 324/426

(58) Field of Classification Search ......... 324/426–434; 320/132
See application file for complete search history.

(56) References Cited

U.S. PATENT DOCUMENTS 6,784,640 B2* 8/2004 Mizuta et al. ............... 320/130
6,836,122 B2* 12/2004 Tojima ....................... 324/426
2007/0018608 A1* 1/2007 Okumura ..................... 320/104

FOREIGN PATENT DOCUMENTS

| JP | A 6-163084 | 6/1994 |
| JP | A 10-123018 | 5/1998 |
| JP | A 2000-234984 | 8/2000 |
| JP | A 2005-137091 | 5/2005 |
| WO | WO 2005/039919 A1 | 5/2005 |

* cited by examiner

*Primary Examiner*—Akm E Ullah
*Assistant Examiner*—Ramy Ramadan
(74) *Attorney, Agent, or Firm*—Oliff & Berridge, PLC

(57) ABSTRACT

A battery life predicting apparatus comprises a data processing unit for obtaining and processing data on a vehicle having a battery used as a power source of the vehicle, the data including battery environment data, power consumption data concerning electrical components, and vehicle running data, a recording unit for recording vehicle characteristic data and histories of the data obtained and processed, a storage for storing data concerning battery deterioration obtained in a vehicle running test, and a controller for estimating a degree of battery deterioration relative to durable years of the battery from the data recorded in the recording unit and calculating remaining life of the battery, and presents the remaining life of the battery to a driver in the display. Further, a battery life warning apparatus estimates a timing of replacing the battery and presents a level of warning to the driver.

10 Claims, 9 Drawing Sheets

POWERTRAIN BATTERY LIFE PREDICTING AND WARNING APPARATUSES

CROSS-REFERENCE TO RELATED APPLICATION

This application claims the benefit of Japanese Patent Application No. 2005-229094 filed on Aug. 8, 2005, and Japanese Patent Application No. 2006-074228 filed on Mar. 17, 2006, the entirety of both of which are hereby incorporated by reference.

BACKGROUND OF THE INVENTION

1. Field of the Invention

The present invention relates to an apparatus for predicting remaining life of a battery mounted on a powertrain as a power source and an apparatus for warning of the end of life of the battery, and relates to a powertrain having the apparatuses installed therein.

2. Description of the Related Art

Here, a term "powertrain" refers to a vehicle in which a battery is used as a part of a power source or used as the power source itself. The vehicle includes, for example, a hybrid vehicle powered by combined use of a gasoline engine and an electric motor similarly to a hybrid system, an electric vehicle powered by a fuel cell, and other known or to be developed vehicles having a battery used as a power source.

A major feature of a hybrid system in a hybrid vehicle is that a gasoline engine and an electric motor are selectively used in accordance with vehicle running conditions, to make full use of the advantages of the gasoline engine and the electric motor while compensating for their disadvantages. Accordingly, a usage pattern of a battery installed in the hybrid vehicle varies depending on running conditions of the vehicle. Specifically, at the time of starting the vehicle or during light load running with poor engine efficiency, for example, the vehicle is mainly powered by the electric motor while making full use of the battery. On the other hand, the vehicle is mainly powered by the gasoline engine during medium-speed low-load running with good engine efficiency, and under acceleration, the gasoline engine is increased in output and assisted by the electric motor as required. Accordingly, the battery is used less during the medium-speed low-load running and under-acceleration. Under deceleration, the electric motor is caused to function as a generator in order to convert kinetic energy of the vehicle into electrical energy for regenerative braking. The converted electrical energy is stored in the battery and reused under acceleration or on other occasions. Thus, the battery used in the hybrid vehicle is discharged under acceleration and charged by the regenerative braking under deceleration, and the charge and discharge of the battery are repeated while the vehicle is running.

A battery installed as a power source in a powertrain deteriorates with time through normal usage, and the life of the battery expires at some point in time because the capability of charging/discharging a cell (a battery capacity) gradually drops as internal resistance of the battery increases due to prolonged running. It is therefore necessary for conditions of the battery in the powertrain to be appropriately kept track of.

Factors influencing age deterioration of a battery include vehicle characteristics, battery environment, power consumed by electrical components, and vehicle running conditions. The vehicle characteristics refer to characteristics relating to a vehicle type, such as, for example, a model year, a vehicle weight, and device specifications. The device specifications refer to, for example, types and capacities of an engine, and electrical components, such as an air conditioner, mounted on the vehicle. The vehicle type and the device specifications are connected with consumption of the battery in the vehicle, thereby being viewed as an influential factor on battery deterioration. The battery environment refers to environment around the battery including a temperature of the battery, an ambient temperature, humidity, and the like. Overcharging or over discharging of the battery promotes battery deterioration. Because over-discharge or overcharge of the battery promotes deterioration, the over-discharging and overcharging are regarded as influential factors on battery deterioration. The electrical components consuming power includes the air conditioner, audio equipment, and other electrical power consuming components mounted on the vehicle. These electrical components are counted as influential factors on battery deterioration because the components use electrical power accumulated in the battery. Further, the vehicle running conditions are related to, for example, a running distance, driving operation of the vehicle, and the like. Because increases of the running distance generally leads to increased battery deterioration, the running distance is regarded as a factor influencing battery deterioration. The degree of battery deterioration varies depending on vehicle driving operation performed by a driver.

As a conventional technique relating to battery deterioration, a system is disclosed in which variations in charge and discharge features among cells are detected to give an advance warning, thereby urging a driver to perform equalizing charge. The cells of a battery do not deteriorate equally with respect to the charge and discharge features, but become deteriorated to varying degrees from cell to cell with respect to charge and discharge features. In view of the fact that the variations which have grown excessively large greatly affect life expectancy of the battery, the advance warning is provide to the driver in the above-described system. When the advance warning is issued, the cells can be refreshed so as to be in a fully charged state by means of low-voltage currents fed into the cells for a prolonged time from an external battery recharger.

As a method for evaluating age deterioration or life expectancy of a battery cell, a method for removing a power output device having a battery to be evaluated and evaluating the removed power output device on a test bench and a method for conducting the evaluation in a running test of an actual vehicle have been conventionally known. The running test of an actual vehicle contains a simulated running test conducted in a laboratory under predetermined experimental conditions and an actual running test conducted using an actual vehicle operated in predetermined driving patterns including metropolitan highway running, urban area running, rough road running and others. Further, a method for directly detecting the capabilities of charging and discharging a battery to determine the degree of battery deterioration and life expectancy of the battery is also known as one of the evaluation methods.

For example, Japanese Patent Laid-Open Publication No. Hei 10-123018 discloses a running test facility of chassis dynamometer type for testing an electric vehicle, and Japanese Patent Laid-Open Publication No. 2000-234984 discloses a performance evaluation system for evaluating a power output device taking into account effects exerted by accessory devices in a vehicle. Further, Japanese Patent Laid-Open Publication No. Hei 6-163084 discloses a method for measuring remaining life of an accumulator battery used for a motor-driven vehicle, and Japanese Patent Laid-Open Publication No. 2005-137091 discloses a display for a vehicle-mounted battery.

In the running test facility disclosed in the Publication No. Hei 10-123018, a vehicle placed on front and rear rollers is driven in a state where a dummy running resistance is exerted on the vehicle using a running resistance generation mechanism to conduct a running test under conditions similar to those of actual running. As a result of the test conducted on an electric vehicle using the running test facility, the efficiency with which supplied power is incorporated into a drive force (running efficiency), a travel range attained in a typical running mode, and the level of a voltage drop in the battery can be determined.

FIG. 9 shows process steps performed in the performance evaluation system for evaluating a power output device disclosed in the Publication No. 2000-234984. Because, in the running test of an actual vehicle, the entire vehicle is subjected to the test, the factors having an effect on performance of the power output device are great in number and in complexity, which causes a problem in accuracy of evaluated data. On the other hand, in the method for removing only the power output device and evaluating the power output device on the test bench, the accessory devices, such as an air conditioner, mounted on the vehicle are not equipped to the test bench, which causes a problem in that effects exerted by the accessory devices remain undetected and constitute an error of the test. Accordingly, in the method for evaluating performance of the power output device disclosed in the above Japanese Patent, data concerning running of a vehicle equipped with the power output device is collected during actual road running and in a running test (S10). Then, operation of the power output device during the running test of the actual vehicle is reproduced in the evaluation system (S12). Data to be evaluated is output (S14), and the performance of the power output device is evaluated using the output data (S16). In the performance evaluation system, the effects exerted by the accessory devices in the vehicle can be included in the evaluation.

In the method for measuring remaining life of an accumulator battery for a motor-driven vehicle according to the above-described Publication No. Hei 6-163084, a voltage value of the accumulator battery for a motor-driven vehicle attained relative to a predetermined discharged capacity during a vehicle run is obtained for each run, and an estimated number of runs until a predetermined end-of-life voltage is attained is obtained using a relational equation between the number of runs and the voltage value. Then, the remaining life is determined from a difference between the estimated number of runs and the number of runs performed at the present time.

The display for a vehicle-mounted battery of the above-described Publication No. 2005-137091 is a device for retrieving voltage-current information at the time of charging and discharging a battery, to compute deterioration information referring to a plurality of charge and discharge voltage-current characteristics corresponding to the degree of deterioration of the battery prestored in a memory means.

As described above, a wide variety of factors affect age deterioration of a battery in a powertrain, and the factors vary depending on the circumstances. To estimate durable years and the degree of deterioration of a battery, it is necessary to take into account all the factors in a comprehensive manner. Because an error contained in an estimation based on only a specific one of the factors is extremely great, the estimation based on such a specific factor is not appropriate for practical use.

The results obtained from vehicle running tests described in the above Publications No. Hei 10-123018 and No. 2000-234984 show age deterioration of a battery only under fixed conditions. Because an actual vehicle run or battery environment generally changes in a complicated manner, the result of a running test cannot be applied to an actual vehicle run without being processed. Thus, it is inappropriate to determine life expectancy of a battery only from numerical values of a running distance of a vehicle, a period of use, or the like, because a greater error will be introduced by such determination.

Because the above-described warning system for urging a driver to perform equalizing charge does not cover age deterioration in capability of charging and discharging the cells as a whole, such a warning system is regarded neither as a device for predicting remaining life of a battery in a powertrain nor a device for warning a driver that the battery has reached the end of its life.

On the other hand, in the methods for directly detecting the capabilities of charging and discharging a battery to determine the degree of deterioration or life expectancy of the battery as described in the above-described Publications No. Hei 6-163084 and No. 2005-137091, it is possible to detect a state of the battery by measuring voltages and currents during charge and discharge operations, but impossible to reliably predict life expectancy of the battery.

Although it is important to keep track of battery conditions in a powertrain, means for predicting or warning of the battery conditions does not exist under present circumstances. In a hybrid vehicle, because the engine functions as an electricity supplier to maintain the battery in a constant charged state during operation without the need to recharge the battery from an external supplier, a driver is less aware of battery life, which provides further problems as described below.

For example, even when capabilities of charging and discharging a battery become deteriorated in a hybrid vehicle having a gasoline engine and an electrical motor as power sources, the gasoline engine automatically compensates for the deterioration, usually without a driver being aware of it. A lack of awareness of battery deterioration forces the gasoline engine having a capacity which is generally smaller than that of a vehicle powered only by a gasoline engine to continue compensating for the deterioration, resulting in poor fuel economy. Further, the lack of awareness of battery deterioration raises a risk that the vehicle will become inoperable due to the end of battery life during a long-distance drive.

SUMMARY OF THE INVENTION

The present invention advantageously provides an apparatus for predicting remaining life of a battery and an apparatus for warning a driver of approaching end of life of the battery in which the aforesaid problems are solved.

A powertrain battery life predicting apparatus according to the present invention has the following characteristics.

(1) The powertrain battery life predicting apparatus comprises a data processing unit for obtaining and processing data on a vehicle in which a battery is installed as a power source of the vehicle, the data consisting of battery environment data, power consumption data concerning electrical components, and vehicle running data; a recording unit for recording vehicle characteristic data and histories of the data obtained and processed; a storage for storing data concerning battery deterioration obtained in a vehicle running test; a controller for estimating a degree of battery deterioration relative to durable years of the battery from the data recorded based on the data concerning battery deterioration in the recording unit and calculating remaining life of the battery, and a display for visually showing information on the remaining life of the battery. With this configuration, remaining life of the battery can be calculated from the degree of battery deterioration using the data concerning battery deterioration accumulated based on results of the vehicle running test, and presented to a driver.

(2) In the powertrain battery life predicting apparatus as defined in characteristics (1), the controller determines a driving pattern of the vehicle from the vehicle running data recorded in the recording unit and estimates a degree of battery deterioration relative to durable years of the battery based on the data concerning battery deterioration in the determined driving pattern stored in the storage. With this configuration, prediction of remaining life in which vehicle running patterns are taken into account can be made with higher precision using the data concerning battery deterioration obtained by measurement in running tests performed for each vehicle running pattern. This is because tendencies of a battery to deteriorate vary depending on vehicle running patterns, as described later.

(3) In the powertrain battery life predicting apparatus as defined in characteristics (1), the controller totalizes degrees of battery deterioration relative to durable years of the battery, wherein the degrees of battery deterioration are estimated from respective history of the battery environment data, power consumption data concerning electrical components, and vehicle running data organized by vehicle characteristic data and recorded in the recording unit, respectively, based on the data concerning battery deterioration. With this configuration, the degree of battery deterioration relative to durable years of the battery can be estimated with respect to each of the battery environment data, power consumption data, and vehicle running data from the results of running test of the vehicle. Then, by totalizing estimated degrees of battery deterioration, calculation of remaining life of the battery and prediction of timing of replacing the battery can be implemented. By taking into account effects exerted on the degree of battery deterioration by each factor, remaining life of the battery can be predicted with higher precision.

(4) The powertrain battery life predicting apparatus as defined in characteristics (1) further comprises an input unit in which a driver of the vehicle enters information on assumed vehicle running. In this powertrain battery life predicting apparatus, the controller estimates the degree of battery deterioration from data recorded based on the data concerning battery deterioration in the recording unit and the information on assumed vehicle running entered in the input unit. With this configuration, the information obtained from the driver can facilitate highly precise prediction of the remaining life of the battery.

(5) In the powertrain battery life predicting apparatus as defined in characteristics (1) to (4), the battery environment data includes a temperature, the vehicle characteristic data includes a vehicle weight, and the vehicle running data includes a vehicle running distance.

(6) In the powertrain battery life predicting apparatus as defined in characteristics (1) to (4), a powertrain is provided with the powertrain battery life predicting apparatus in an operating section.

A powertrain battery life warning apparatus according to the present invention has the following characteristics.

(1) The powertrain battery life warning apparatus comprises a data processing unit for obtaining and processing data on a vehicle in which a battery is installed as a power source of the vehicle, the data consisting of battery environment data, power consumption data concerning electrical components, and vehicle running data; a recording unit for recording vehicle characteristic data and histories of the data obtained and processed; a storage for storing data concerning battery deterioration obtained in a vehicle running test; a controller for estimating a degree of battery deterioration relative to durable years of the battery from the data recorded based on the data concerning battery deterioration in the recording unit, predicting the timing of replacing the battery, and determining a level of warning, and a display for visually showing information on the level of warning of the battery. With this configuration, the degree of battery deterioration relative to durable years of the battery can be estimated from the vehicle characteristic data, battery environment data, and vehicle running data using the data concerning battery deterioration accumulated based on results of the vehicle running test, and a timing of replacing the battery can be predicted from the estimated degree of battery deterioration, to warn a driver of an approaching end of life of the battery.

(2) In the powertrain battery life warning apparatus as defined in characteristics (1), the controller determines a driving pattern of the vehicle from the vehicle running data recorded in the recording unit and estimates a degree of battery deterioration relative to durable years of the battery based on the data concerning battery deterioration in the determined driving pattern stored in the storage. With this configuration, warning of remaining life in which vehicle running patterns are taken into account can be issued with higher precision using the data concerning battery deterioration obtained by measurement in running tests performed for each vehicle running pattern. This is because tendencies of a battery to deteriorate vary depending on vehicle running patterns, as described later.

(3) In the powertrain battery life warning apparatus as defined in characteristics (1), the controller totalizes degrees of battery deterioration relative to durable years of the battery, wherein the degrees of battery deterioration are estimated from respective history of the battery environment data, power consumption data concerning electrical components, and vehicle running data organized by vehicle characteristic data and recorded in the recording unit, respectively, based on the data concerning battery deterioration. Then, by totalizing estimated degrees of battery deterioration, calculation of remaining life of the battery and prediction of timing of replacing the battery can be implemented. By taking into account effects exerted on the degree of battery deterioration by each factor, remaining life of the battery can be notified with higher precision.

(4) The powertrain battery life warning apparatus as defined in characteristics (1) further comprises an input unit in which a driver of the vehicle enters information on assumed vehicle running. In this powertrain battery life warning apparatus, the controller estimates the degree of battery deterioration from data recorded based on the data concerning battery deterioration in the recording unit and the information on assumed vehicle running entered in the input unit. With this configuration, the information obtained from the driver can facilitate highly precise warning of the remaining life of the battery.

(5) In the powertrain battery life warning apparatus as defined in characteristics (1) to (4), the battery environment data includes a temperature, the vehicle characteristic data includes a vehicle weight, and the vehicle running data includes a vehicle running distance.

(6) In the powertrain battery life warning apparatus as defined in characteristics (1) to (4), a powertrain is provided with the powertrain battery life warning apparatus in an operating section.

BRIEF DESCRIPTION OF THE DRAWINGS

Preferred embodiments of the present invention will be described in detail based on the following figures, wherein.

DESCRIPTION OF THE PREFERRED EMBODIMENTS

Figure 1:
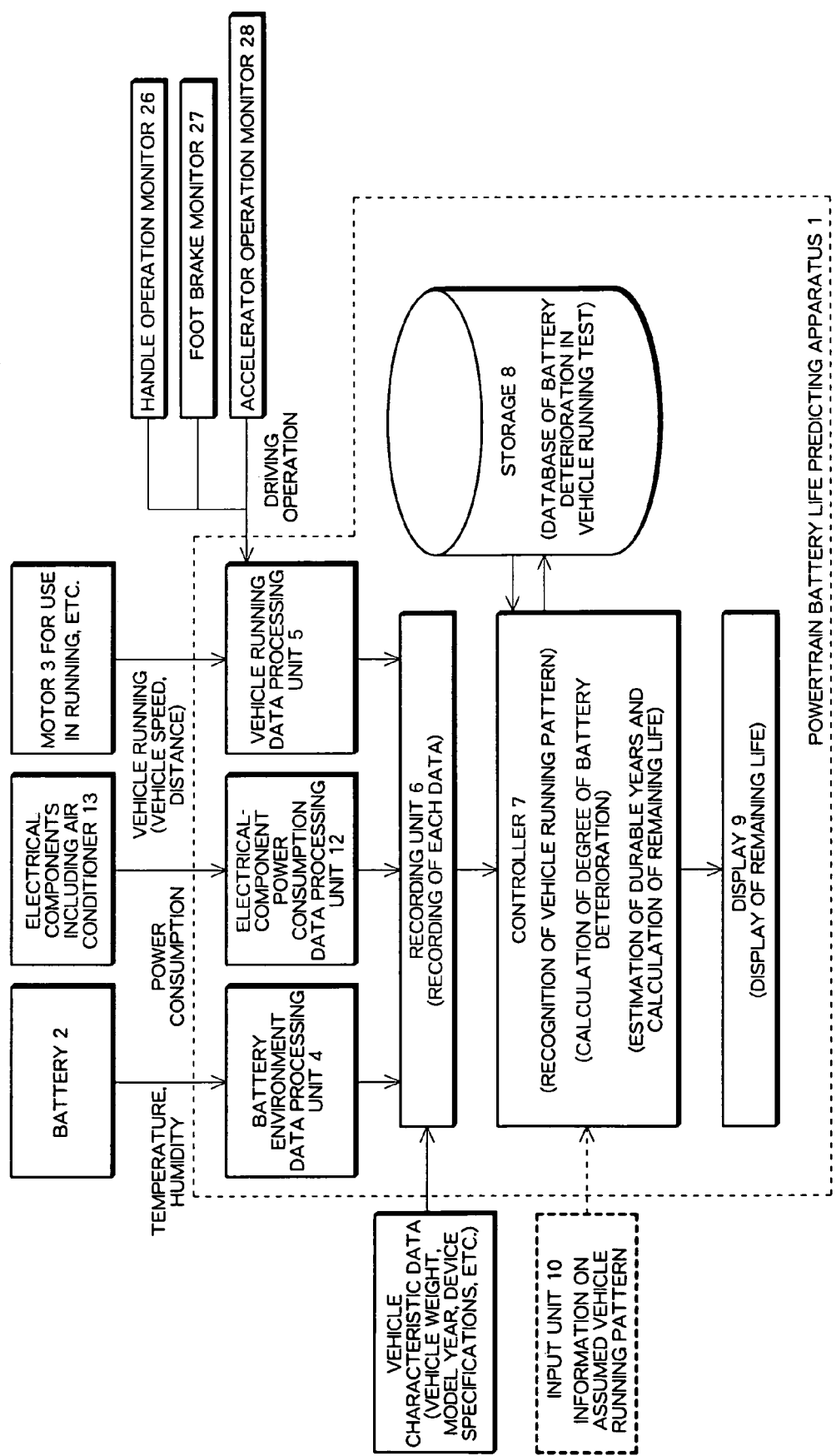
FIG. 1 is a block diagram schematically showing a basic configuration of a powertrain battery life predicting apparatus according to an embodiment of the present invention.

Referring to the drawings, an embodiment of the present invention will be described below.

(1) Powertrain Battery Life Predicting Apparatus

FIG. 1 schematically shows a basic configuration of a powertrain battery life predicting apparatus 1 according to an embodiment of the present invention. This apparatus comprises an environment data processing unit 4 for processing data on environment around a battery 2, a power consumption data processing unit 12 for processing power consumption data concerning electrical components, a vehicle running data processing unit 5, a recording unit 6, a controller 7, a storage 8, and a display 9.

Here, the term "battery" refers to a high-voltage battery of 144V~288V for supplying power to an inverter which drives and controls a motor used for vehicle running.

Figure 2:
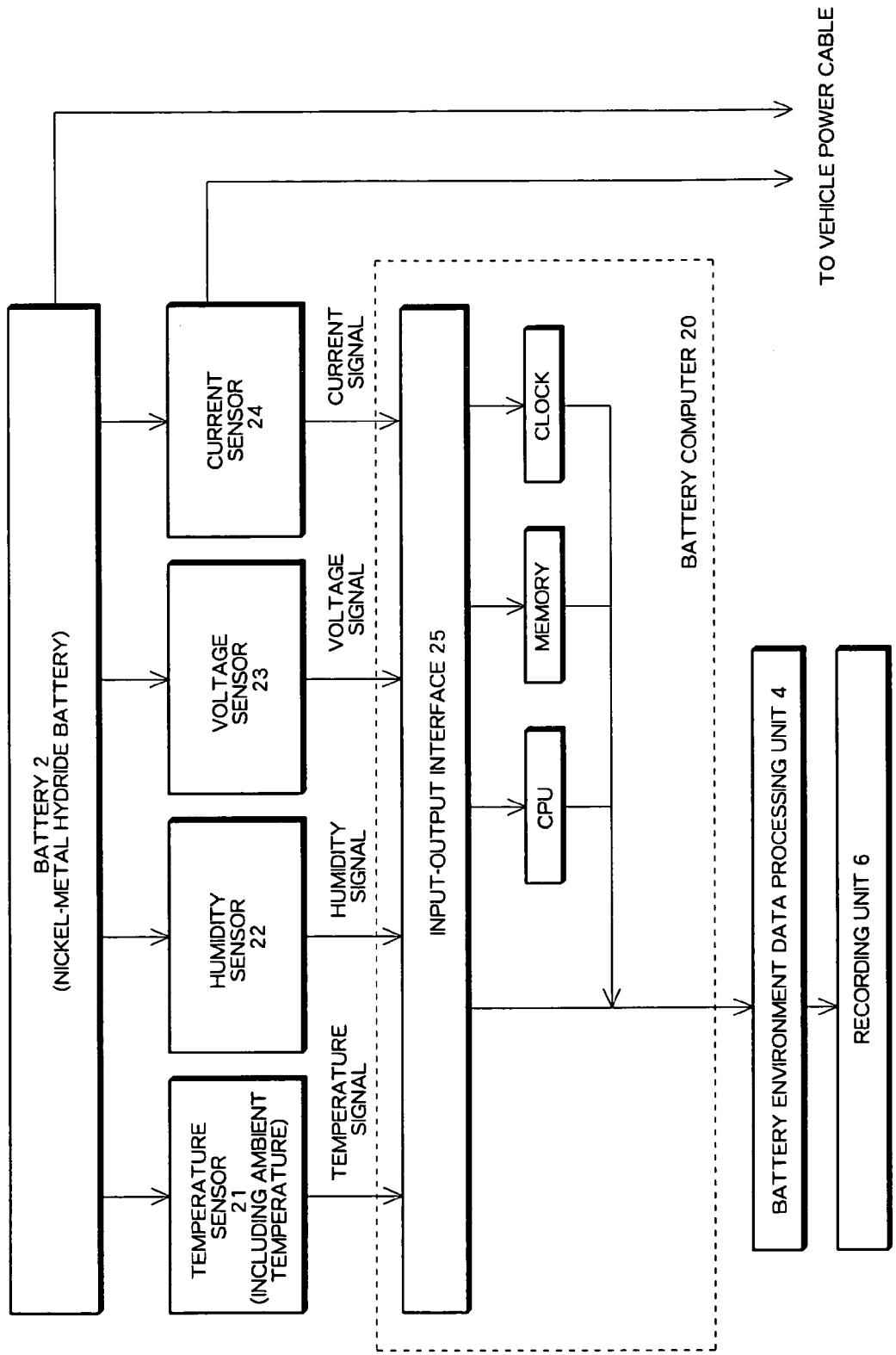
FIG. 2 is a block diagram schematically showing a configuration of an environment data processing unit for obtaining and processing data on a battery and battery environment.

The environment data processing unit 4 measures conditions, such as temperature or humidity of the battery 2 in a powertrain, which are regarded as factors influential on deterioration of the battery 2. FIG. 2 schematically shows the battery 2 and the environment data processing unit 4 for processing data on environment around the battery 2. The battery 2 is generally composed of several tens of battery modules connected in series. In the present embodiment, a nickel-metal hydride battery is used as the battery 2. A temperature sensor 21, a humidity sensor 22, a voltage sensor 23, and a current sensor 24 are attached to the battery 2. Data obtained by the sensors 21 to 24 is sent via an input-output interface 25 to a battery computer 20. The environment data processing unit 4 receives from the input-output interface 25 data on temperatures measured by the temperature sensor 21 and humidities measured by the humidity sensor 22. Alternatively, the environment data processing unit 4 may receive the data from the battery computer 20. In addition to the above-described data on environment around the battery 2, the environment data processing unit 4 may receive, for example, data on voltages measured by the voltage sensor 23 or on currents measured by the current sensor 24, when these data items are required for predicting life expectancy of powertrain battery. The environmental data processing unit 4 transmits the data to the recording unit 6.

The battery 2 is controlled such that a charged capacity and a discharged capacity of the battery 2 stay within a predetermined capacity. Because battery performance decreases when the charged capacity or discharged capacity increases, especially, when the battery is overcharged or over discharged, the above control is performed to avoid the decrease of battery performance. Further, an increase of the charged capacity or the discharged capacity causes the battery 2 to get hot. Accordingly, the temperature of the battery 2 and an ambient temperature around the battery 2 are regarded as influential factors on durable years of the battery 2. For example, in a hybrid vehicle, the motor is driven by wheels under deceleration, thereby causing the motor to function as a generator for regenerative electric power generation. Energy collected through the regenerative electrical power generation is accumulated in the battery 2. If a high volume of electrical power is fed into the battery 2 during the regenerative electric power generation, the battery 2 will become overcharged, which is accompanied with a sharp increase in temperature of the battery 2. Therefore, battery deterioration due to an overcharge or an over discharge can be detected by constant monitoring of the temperature of the battery 2. The overcharge or the over discharge is, of cause, controlled by the battery computer 20 as described below. The battery computer 20 sums up measurement values of the current sensor 24 with respect to charged or discharged currents for managing a state of charge (SOC) of the battery 2. Further, the battery computer 20 performs temperature control to secure appropriate battery performance. Specifically, when the battery 2 generates heat due to charge and discharge currents, the battery computer 20 activates a cooling fan (not illustrated) for cooling. Under the above-described management of the SOC, the possibility of the battery 2 being overcharged or over discharged, and the temperature of the battery 2 reaching abnormal values is extremely low. However, because changes in temperature have a certain influence on battery deterioration, even when the temperature varies within a control range, battery deterioration can be determined by referring to histories of the temperature of the battery 2.

The power consumption data processing unit 12 for processing power consumption data concerning electrical components determines a consumption of electrical power, which is viewed as an influential factor on durable years of the battery 2, consumed by electrical components including an air conditioner 13, audio equipment, a display, a heater, an in-car navigation system, and the like mounted in the vehicle. The voltage of 144V ~288V of the above-described high-voltage battery is stepped down by a DC/DC converter for charging a so-called auxiliary battery of 12V, and the stepped down voltage is supplied from the auxiliary battery to the electrical components. The electrical components subjected to measurement performed by the power consumption data processing unit 12 include all electrical devices deemed to be influential on battery deterioration. The power consumption data processing unit 12 transmits the data on power consumed by the electrical components to the recording unit 6.

The vehicle running data processing unit 5 acquires vehicle running data to be influential on durable years of the battery 2, such as, for example, data on a running distance of the powertrain, vehicle speed, and the like, from the motor 3 for use in running or the like. Concurrently with acquisition of the above data, the vehicle running data processing unit 5 further obtains data on driving operation performed by a driver, such as, for example, data on handle operation, foot brake operation, and accelerator operation, from a handle operation monitor 26, a foot brake operation monitor 27, accelerator operation monitor 28, respectively, to recognize a running pattern of the vehicle. The vehicle running data and driving operation data are transmitted to the recording unit 6. Data items other than the above-described items may be included as data to be used for predicting the life expectancy of the battery for the powertrain. For example, in a hybrid vehicle driven through selective use of the gasoline engine and the electric motor, values associated with controlling of the gasoline engine and the electric motor may be measured and processed as measurement data.

The processing units 4, 12, and 5 transmit data to the recording unit 6 at each fixed measurement period which is appropriately determined to recognize the running pattern of the vehicle. Alternatively, the data may be sequentially transmitted from the processing units 4, 12, and 5 to the recording unit 6 and processed by the controller 7 at established periods.

In the recording unit 6, vehicle characteristic data is recorded. The vehicle characteristic data includes data concerning device specifications, such as a vehicle weight, a model year of the vehicle, types and capacities of the engine, the air conditioner 13, and various electrical components mounted on the vehicle, and the like. Details of the vehicle characteristic data are determined based on standard specifications and options installed and recorded in the recording unit 6 at the time of purchase of the vehicle. When another option is added or the options are changed after the purchase of the vehicle, data on the addition or the change is posted in the recording unit 6 to update the vehicle characteristic data. In addition, the environment data of the battery 2, power consumption data concerning the electrical components, and vehicle running data are accumulated in the recording unit 6 as histories of the data. The above-described data items are minimum requirements for predicting the life expectancy of the powertrain battery, and data items other than those described above, such as data concerning driving and controlling of the gasoline engine and the electric motor, may be recorded.

Figure 3:
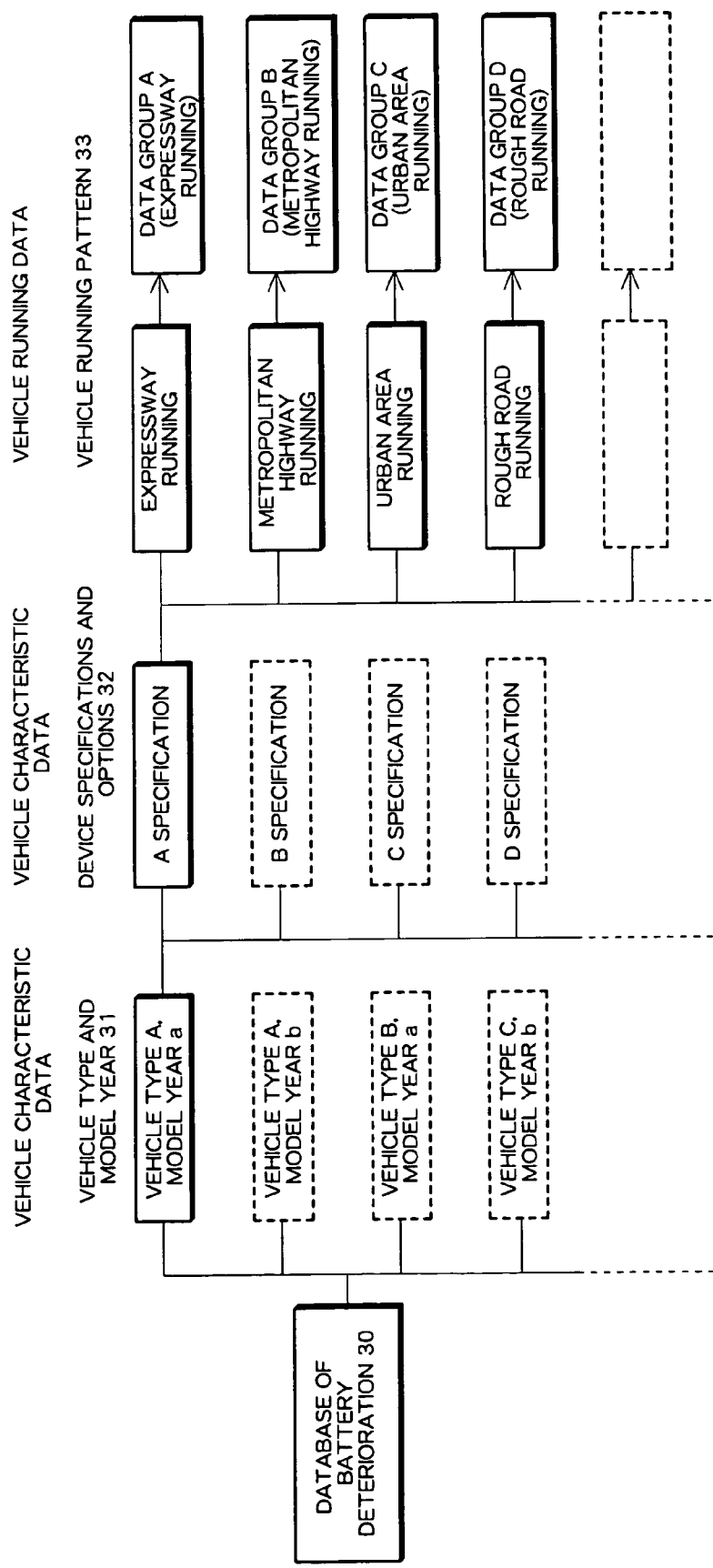
FIG. 3 is a conceptual diagram schematically showing a configuration of a database concerning battery deterioration stored in a storage.

The storage 8 stores a database of battery deterioration created based on results of vehicle running tests. Specifically, the results of vehicle running tests performed using an actual vehicle and performance evaluation values obtained using the system for evaluating performance of a power output device such as described in Japanese Patent Laid-Open No. 2000-234984 described above are collected and stored in the database of battery deterioration in the powertrain. FIG. 3 schematically shows a structure of the database 30 of battery deterioration. The database 30 is organized by combination of vehicle type and model year of the vehicle, and by device specifications and options 31. In this structure, the database 30 may store data items only associated with standard device specifications of a vehicle type concerned, and a revised database 30' may be created for optional device specifications. Further, the database is organized by vehicle running pattern 33. Then, data groups A, B, C, D . . . including durable years and progress states of battery deterioration in each vehicle running pattern 33 are extracted from the results of running tests performed using an actual vehicle and the evaluation results obtained using the system for evaluating performance of a power output device as described in the above Japanese Publication. Here, the vehicle running pattern 33 are categorized according to differences in running conditions as expressway running, metropolitan highway running, urban area running, rough road running, and the like. The vehicle running pattern 33 may be further sub-grouped according to levels of traffic congestion in such a manner that the expressway running is divided into normal running and congested running, and the metropolitan highway running is similarly divided into normal running and congested running.

Figure 4:
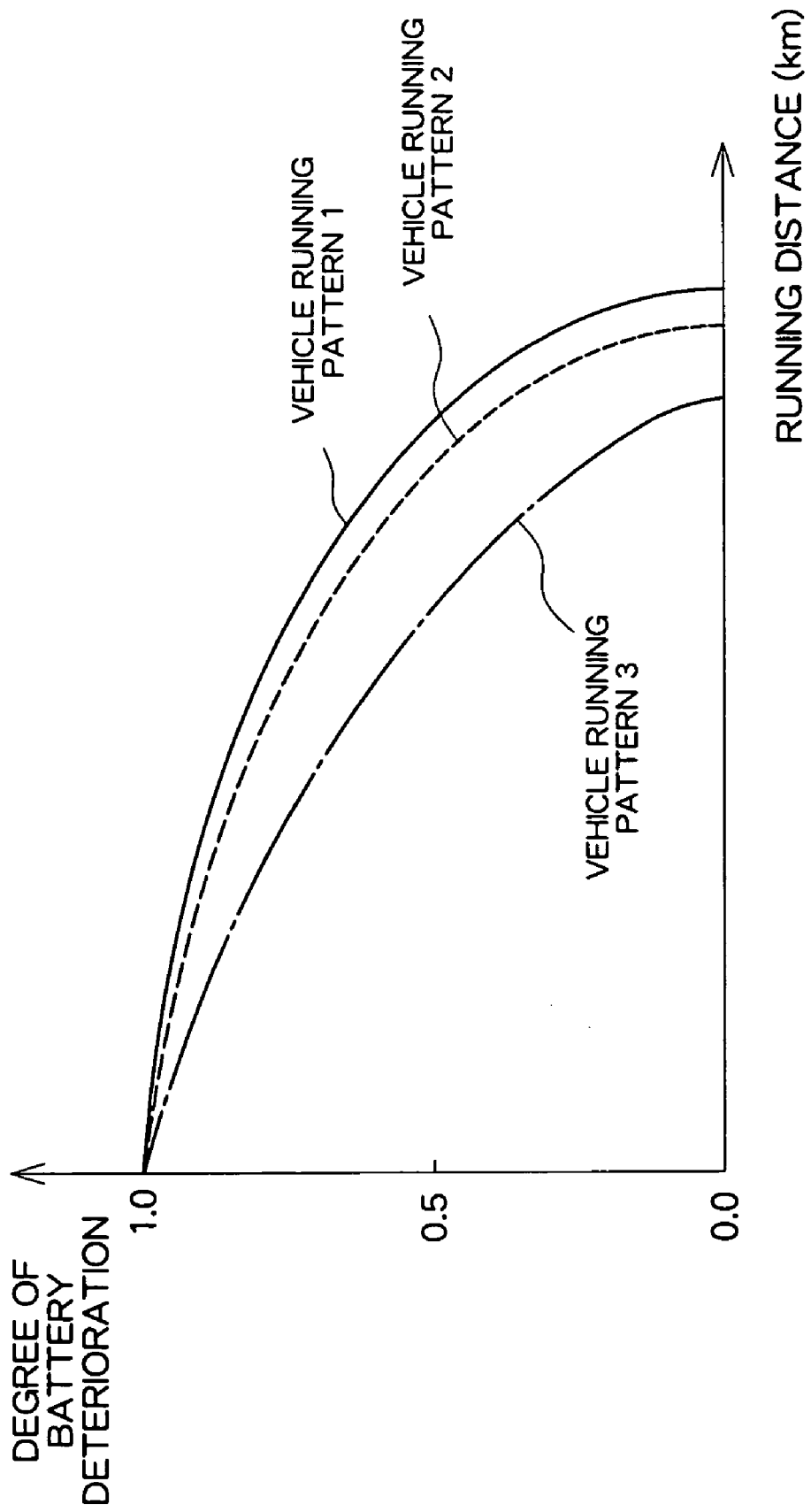
FIG. 4 is a graphical representation of an example of the database concerning battery deterioration extracted from results of vehicle running tests.

FIG. 4 shows a diagram for explaining an example of the database 30 of battery deterioration organized by each vehicle running pattern 33 extracted from the results of vehicle running test. The example of the database 30 is shown in the form of a graph representing the degree of battery deterioration in accordance with running distances for each vehicle running pattern 33. Here, the degree of battery deterioration before the initiation of actual running of a vehicle is taken as 1.0, and a point in time when the need for replacing the battery arises is taken as 0.0. Each curve for the vehicle running pattern 33 is an idealized curve plotted using values extracted from the results of vehicle running tests. Here, a total running time of the vehicle until the degree of battery deterioration reaches 0.0 is calculated for each vehicle running pattern 33. A value obtained by dividing the calculated total running-time by a predicted value for yearly total of running distances is the number of durable years of the battery 2. The predicted value for yearly total of running distances is calculated from an actual yearly total of running distances measured during actual running, and an accuracy of the predicted value increases as the number of years the vehicle is used increases. In the database 30 according to the present embodiment, a degree of battery deterioration corresponding to each running distance is stored in accordance with a temperature and humidity of the battery 2 for the environment data of the battery 2. For the power consumption data concerning electrical components, on the other hand, a degree of battery deterioration corresponding to each running distance is stored in accordance with a consumption of power used by the electrical components. The number of durable years of the battery 2 and the degree of battery deterioration corresponding to each running distance are established for each influential factor on battery deterioration from the database 30.

The controller 7 calculates, as the degrees of battery deterioration (D), influential levels on age deterioration organized by each influential factor on battery deterioration using the vehicle characteristic data in addition to the battery environment data, power consumption data concerning electrical components, and the vehicle running data transmitted from the recording unit 6 at fixed periods, and accumulates calculated results. Further, the number of durable years of the battery 2 is estimated from the accumulated influential levels, and remaining life is calculated from the number of years that the vehicle has been used until then.

Figure 5:
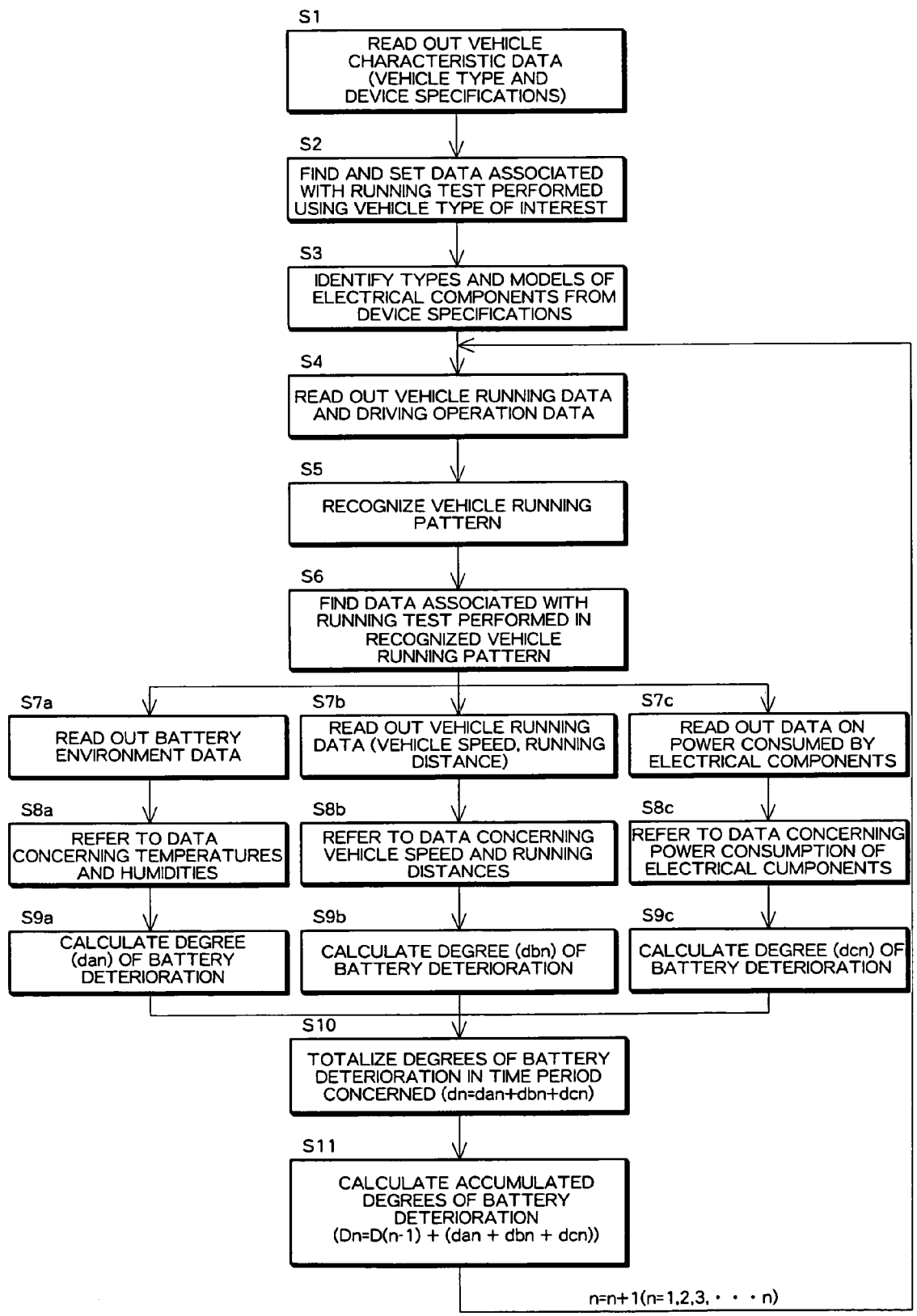
FIG. 5 is a flowchart showing process steps for calculating battery deterioration in a controller.

FIG. 5 shows process steps for calculating the degree of battery deterioration in the controller 7. The controller 7 reads out the vehicle characteristic data (vehicle types and device specifications) recorded in the recording unit 6 (S1). The characteristic data is determined according to standard and optional specifications at the time of purchase of the vehicle and is automatically read as initial values. Next, a database having results of running tests conducted using a vehicle of the same type and the same model year is found and set (S2). Data concerning battery deterioration obtained in the running tests is organized by vehicle type and configured as the database 30. Accordingly, the database 30 associated with the corresponding type of the vehicle is stored in the controller 7 at the time of purchase of the vehicle. Next, types and device names of the electrical components are identified from the read device specifications (S3). Items of the power consumption data concerning electrical components are specified based on the identified types and device names. When options are added or changed after the purchase of the vehicle, data on the options are written, and the controller 7 reads out the added or updated data.

After actual running of the vehicle has started, the controller 7 processes the data transmitted from the recording unit 6 at established periods according to the steps which will be described below to calculate the degree of battery deterioration in a pertinent one of the established periods. First, data on a running speed and a running distance of the vehicle constituting the vehicle running data and driving operation data are read out (S4). The vehicle running pattern 33 in the pertinent one of the established periods is recognized from the data on the read data (S5). The vehicle running pattern 33 is one of, for example, expressway running, metropolitan highway running, urban area running, rough road running, and the like categorized according to running conditions determined by the vehicle running test and stored in the storage 8. The driving operation data includes handle operation data, foot brake operation data, accelerator operation data, and the like. The controller 7 recognizes a running state or a running path of the vehicle from the above-described data and further recognizes driving operation, such as, cornering, lane changing, start, or stop, of the vehicle from the handle operation data, foot brake operation data, accelerator operation data in the pertinent one of the established periods. Upon recognition of the vehicle running pattern 33, the controller 7 searches the database 30 to find running test data associated with the recognized running pattern 33 (S6).

The controller 7 simultaneously performs readout of environment data of the battery 2 (S7$a$), readout of vehicle running data (the vehicle speed and running distance) (S7$b$), and readout of power consumption data concerning electrical components (S7$c$) accumulated in the pertinent one of the established periods. The data read in the step 4 is used as the vehicle running data (the vehicle speeds and running distance). Values of temperature, humidity, and the like stored in the database 30 are referenced to calculate a degree of battery deterioration (dan) in accordance with the environment data of the battery 2 (S9$a$) using a method which will be described below. Further, values of the vehicle speed and running distance stored in the database 30 are referenced (S8$b$) to calculate a degree of battery deterioration (dbn) in accordance with the vehicle running data using the below-described method (S9$b$). Values of power consumption stored in the database 30 are referenced (S8$c$) to calculate a degree of battery deterioration (dcn) in accordance with the power consumption data concerning electrical components using the below-described method (S9$c$). In the above description, reference character n is a variable representing the number of repetitions of the established period. Here, a total degree of battery deterioration in the n-th established period (dn=dan+dbn+dcn) is calculated (S10). Further, an accumulated total degree of battery deterioration (Dn) at the n-th established period is obtained by adding the total degree of battery deterioration in the n-th established period to a previous accumulated total degree (Dn−1) of battery deterioration at the previous (n−1)-th established period (S11). The number of repetitions n is cumulatively counted from the start of actual operation of the vehicle. Upon completion of calculation of the accumulated total degree of battery deterioration (Dn), operation moves back to step 4 to initiate (n+1)-th processing.

Here, the controller 7 calculates the degree of battery deterioration for each vehicle running pattern 33 from measurement results of the running tests stored in the storage 8 because the effect exerted on life expectancy of the battery 2 differs according to the vehicle running patterns 33. During expressway running, for example, the number of instances where driving operation, such as cornering, start, or stop, is performed using the electric motor as the power source is small, whereas a proportion of middle-speed low-load running in which engine efficiency is good or acceleration powered by the gasoline engine with the electric motor being accessorily used is great. During metropolitan highway running, on the other hand, the proportion of middle-speed low-load running in which engine efficiency is good is small, while driving operation, such as cornering, start, or stop, using the electric motor as the power source is often performed. Further, under deceleration, operation of charging the battery 2 by means of regenerative braking is repeated. Accordingly, the remaining life of the battery 2 can be predicted with high accuracy by evaluating the degree of battery deterioration for each vehicle running pattern.

The controller 7 multiplies a reciprocal (1/T) of the number of durable years for which the battery 2 is useful (T) specified assuming that the vehicle runs continuously in the recognized vehicle running pattern 33 stored in the database 30 in the storage 8 by a fixed time period tn (n=1, 2, 3, . . . ) and by a correction coefficient an (n=1, 2, 3, . . . ). A value (tn/T) obtained by multiplying the reciprocal of the number of durable years by the fixed time period represents an assumed degree of battery deterioration relative to the durable years of the battery 2 attained in the recognized vehicle running pattern 33 during the fixed time period. Further, the correction coefficient an is a coefficient for correction when the degree of battery deterioration which does not decline at a uniform rate with respect to a time axis. The coefficient is determined as shown in FIG. 4 using an idealized curve extracted from a table of battery deterioration obtained by test running. Consequently, a calculated value (αn×tn/T) represents a degree of battery deterioration during the fixed time period (dn where n=1, 2, 3, . . . ). Further, the accumulated value (D) obtained by summing the degrees of battery deterioration (dn) in each vehicle running pattern 33 recognized at predetermined intervals (=d1+d2+d3+ . . . dn=α1×t1/T+α2×t2/T+α3×t3/T+ . . . αn×tn/T) represents the degree of battery deterioration at this point in time (n). Using the accumulated value D, remaining life R of the battery 2 is expressed as R=1−D.

The controller 7 totalizes the degree of battery deterioration based on the vehicle running data in the recognized vehicle running pattern 33 (Db), the degree of battery deterioration (Da) calculated from the environment data of the battery 2, and the degree of battery deterioration (Dc) calculated from the power consumption data concerning electrical components, to obtain the accumulated degree D of battery deterioration. When the database 30 storing the measurement results of running tests is established such that a summation of the degrees of battery deterioration specified for each factor represents the comprehensive degree of battery deterioration, D is represented as D=Db+Da+Dc. Alternatively, in another embodiment, the degree of deterioration (Db) based on the vehicle running data associated with the vehicle running pattern 33 may be used as a base value while taking the degree of battery deterioration (Da) calculated from the environment data of the battery 2 and the degree of battery deterioration (Dc) calculated from the power consumption data concerning electrical components as correction values.

One reason for using the above-described correction values is to take into account an effect exerted on battery deterioration by the driving operation of the driver. For example, during metropolitan highway running, driving operation, such as cornering, start, stop, or the like is performed at frequent intervals while repetitively charging or discharging the battery 2 at short time intervals. Such a way of driving is contained in the measurement results of test running in the vehicle running pattern 33 implemented in a metropolitan area. The measurement results of test running is data based on a specific driving technique of a certain driver, and the results will vary depending on the driver. To compensate for variations of the results, the degree of battery deterioration (Da) calculated from the environment data of the battery 2 is taken as a correction value to the standard value relative to the degree of battery deterioration (Db) based on the vehicle running data associated with the recognized vehicle running pattern 33. Because usage of the electrical components, such as the air conditioner 13, audio equipment, or the like changes depending on a person or on a season, another reason for using the above-described correction values is to take into account an effect of variations depending on a person, a season, or the like exerted on battery deterioration. To compensate for variations depending on a person or the like, the degree of battery deterioration (Dc) calculated from the power consumption data concerning electrical components is taken as a correction value to the standard value relative to the degree of battery deterioration (Db) based on the vehicle running data associated with the recognized vehicle running pattern 33. Therefore, when the correction values are used, the accumulated degree of battery deterioration D is expressed as D=Db±Da±Dc.

The degree of battery deterioration (D) based on the above-described data obtained by totalizing the degrees of battery deterioration (db, da, and dc) associated with the vehicle running patterns 33 recognized in each fixed time period after actual operation of the vehicle has started using the above-described method represents a degree of battery deterioration at a point in time (n). Therefore, the remaining life R of the battery 2 is represented as R=1−D. The controller 7 transmits the remaining life R of the battery 2 to the display 9 at predetermined intervals.

Figure 6:
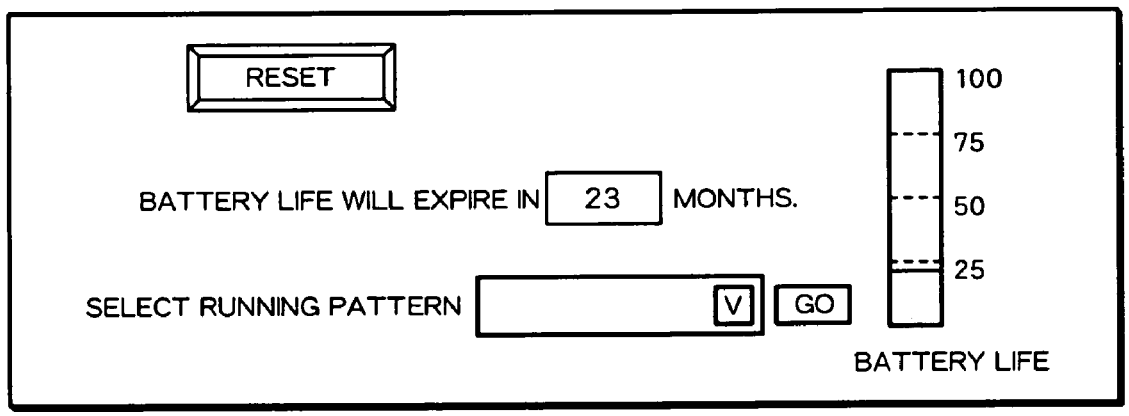
FIG. 6 is an example of a display mode of the battery life predicting apparatus.

The display 9 visually shows the remaining life R calculated in the controller 7. FIG. 6 shows an example of a display mode implemented by the display 9. The display mode may be implemented in various ways, and the display mode includes any mode of display as long as the display enables a driver to appropriately recognize the remaining life R. For example, the remaining life R may be shown digitally. Because the remaining life R is an estimated value, the remaining life R may be shown using a bar having a fixed width, or a likelihood of occurrence of the remaining life R calculated using a stochastic technique may be shown additionally. Further, instead of digital representation, the remaining life R may be shown by analog representation using, for example a bar chart, a pie chart, or the like. Still further, influential degrees on age deterioration in the past organized by month are plotted on a graph, and the graph may be additionally shown. It is preferred that the display 9 be incorporated into an instrument panel placed at the front of the driver seat in the vehicle for allowing the driver to view the display 9 as needed.

The durable years and remaining life R of the battery 2 estimated in the basic configuration of the powertrain battery life predicting apparatus 1 are accumulated based on the vehicle running pattern 33 in the corresponding fixed time period. When the vehicle running pattern 33 of the driver changes due to transfer to another working site, a new vehicle running pattern 33 is used for the estimation, and the remaining life R reflecting the new vehicle running pattern 33 will be displayed after a set period of time.

In another embodiment, the powertrain battery life predicting apparatus 1 comprises an input unit 10 in which the driver enters the vehicle running pattern 33. In FIG. 1, the input unit 10 is shown by a broken line. When changes in the vehicle running pattern 33 are expected beforehand, the driver selects a pattern close to the expectation among existing choices and inputs the selected pattern into the input unit 10 by himself or herself. The choices are, for example, "switching to car commuting", "switching to train commuting", "taking a long-distance drive using expressways", and the like. In addition, the driver may be prompted to select and enter assumed commuting hours or an approximate distance traveled during the long-distance drive. As a result of the input, the controller 7 is allowed to skip steps 4 and 5 shown in FIG. 5 and find the database 30 storing the results of running rest corresponding to the input vehicle running pattern 33. Such an input method is useful for improving accuracy especially when the remaining life R is getting short.

(2) Powertrain Battery Life Warning Apparatus

Figure 7:
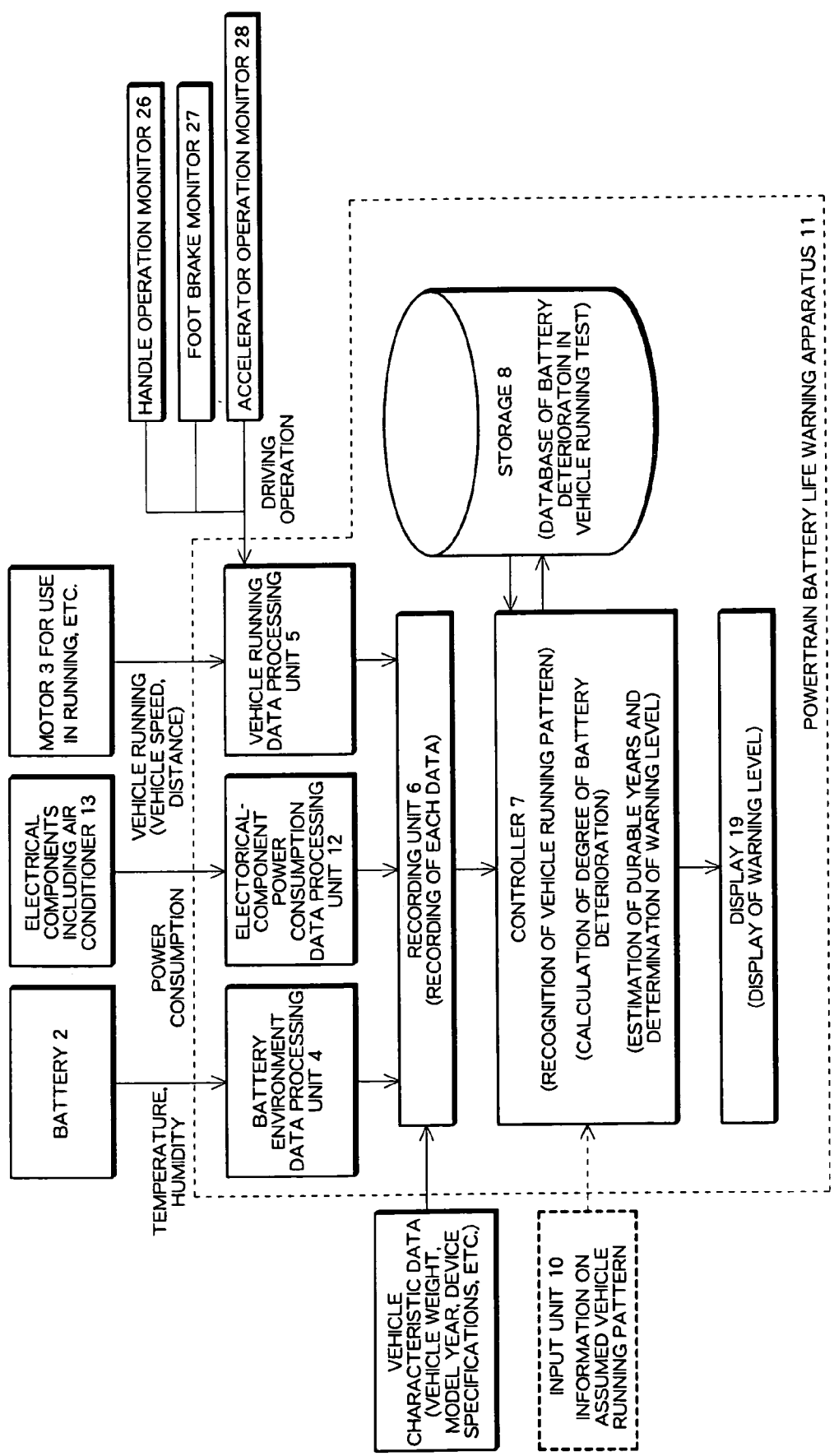
FIG. 7 is a block diagram schematically showing a basic configuration of a powertrain battery life warning apparatus according to an embodiment of the present invention.

FIG. 7 shows a block diagram representing a basic configuration of a powertrain battery life warning apparatus 11 according to an embodiment of the present invention. The apparatus 11 comprises an environment data processing unit 4 for processing data on environment around the battery 2, a vehicle running data processing unit 5, a recording unit 6, a controller 17, a storage 8, and a display 19. Components similar to those in the powertrain battery life predicting apparatus 1 are identified by the same reference numerals as those of the powertrain battery life predicting apparatus 1, and the descriptions related to the components will not be repeated.

The controller 17 calculates and accumulates, as the degree of battery deterioration (D), influential degrees on age deterioration organized by factor which affects battery deterioration using the battery environment data, the power consumption data concerning electrical components, and the vehicle running data transmitted from the recording unit 6 at predetermined intervals and the vehicle characteristic data. The controller 17 further estimates durable years of the battery 2 from the accumulated influential degrees, to predict the timing of replacing the battery 2. Warning messages to a driver are preset in accordance with level of warning, and the controller 17 determines an appropriate level of warning. The level of warning may consist of two levels of "battery replacement is needed" and "battery replacement is unnecessary", for example, or may consist of more detailed levels of "battery replacement is needed", "battery replacement will be needed shortly", and "battery replacement is unnecessary".

Figure 8:
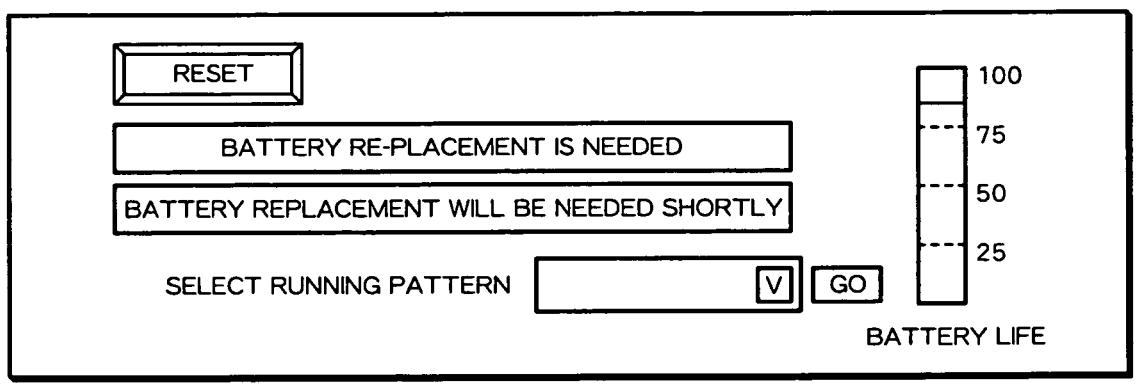
FIG. 8 is an example of a display mode of the battery life warning apparatus.
Figure 9:
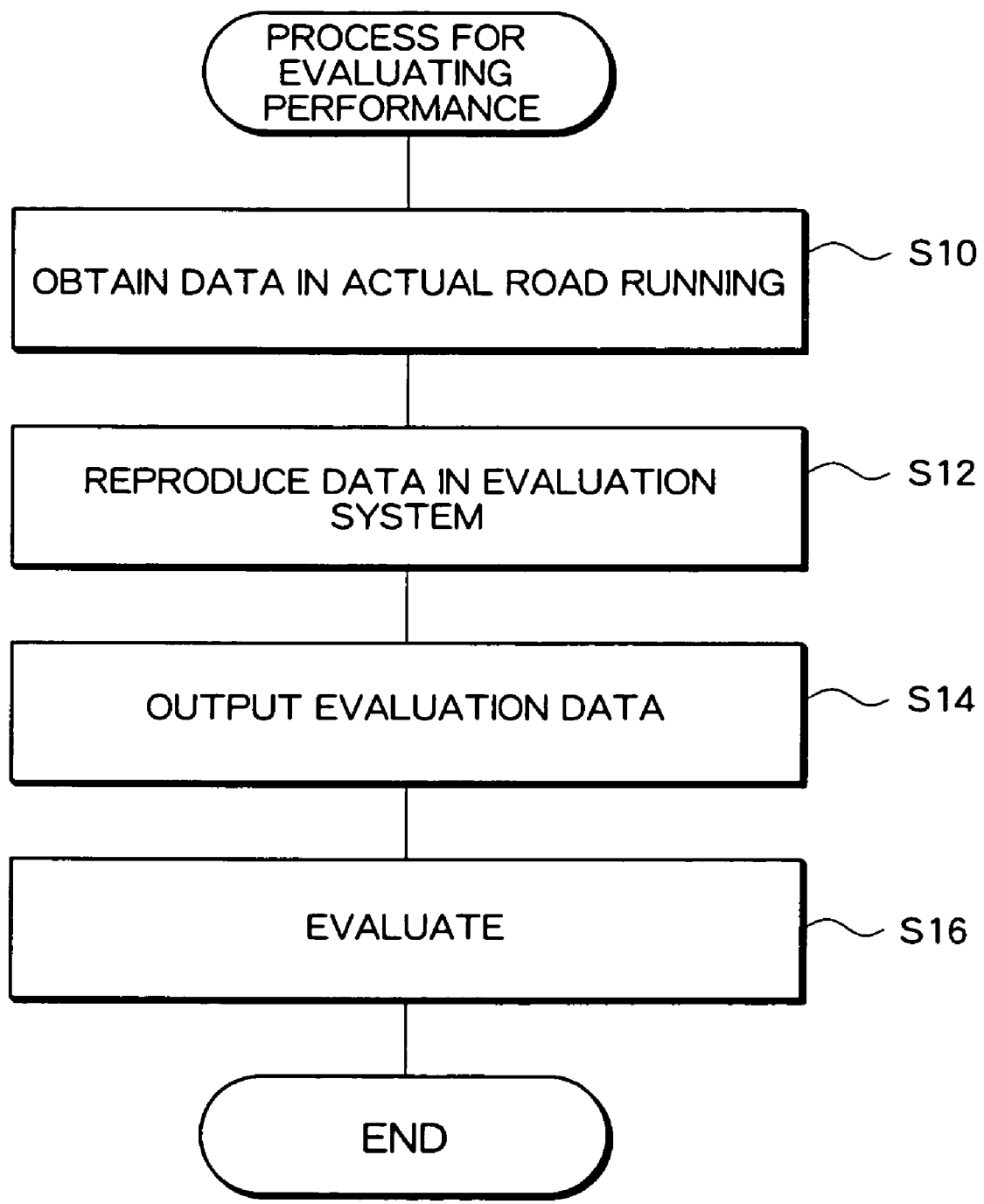
FIG. 9 shows process steps performed in a conventional performance evaluation system for evaluating performance of a power output apparatus.

The display 19 visually shows the level of warning determined by the controller 17. FIG. 8 shows an example of a display mode implemented by the display 19. The display mode may be implemented in various ways, and the display mode includes any mode of display as long as the display enables a driver to appropriately recognize the level of warning. For example, a panel for displaying a text message regarding battery replacement may be flickered. Instead of the text message, the levels of warning may be presented by color, for example, using blue, yellow, and red lamps. In addition, the levels of warning may be indicated by a bar chart which becomes yellow or red when a certain level is exceeded. It is preferred that the display 19 be incorporated into an instrument panel placed at the front of the driver seat in the vehicle for allowing the driver to view the display 9 as needed.

In another embodiment, the powertrain battery life warning apparatus 11 may further comprise the input unit 10 in which a driver inputs his/her vehicle running pattern 33 similarly to the powertrain battery life predicting apparatus 1. The input facilitates provision of levels of warning with higher degree of accuracy, and is useful for improving accuracy especially when the useful life is getting short.

What is claimed is:

1. A powertrain battery life predicting apparatus comprising:
   a data processing unit for obtaining and processing data on a vehicle in which a battery is installed as a power source of the vehicle, the data consisting of battery environment data, power consumption data concerning electrical components, and vehicle running data;
   a recording unit for recording vehicle characteristic data and histories of the data obtained and processed;
   wherein the battery environment data includes a temperature, the vehicle characteristic data includes a vehicle weight, and the vehicle running data includes a vehicle running distance;
   a storage for storing data concerning battery deterioration obtained in a vehicle running test;
   a controller for estimating a degree of battery deterioration relative to durable years of the battery from the vehicle characteristic data and the histories of the data recorded based on the data concerning battery deterioration in the recording unit and calculating remaining life of the battery; and
   a display for visually showing information on the remaining life of the battery.

2. A powertrain battery life predicting apparatus according to claim 1, wherein
   the controller determines a driving pattern of the vehicle from the vehicle running data recorded in the recording unit and estimates a degree of battery deterioration relative to durable years of the battery based on the data concerning battery deterioration in the determined driving pattern stored in the storage.

3. A powertrain battery life predicting apparatus according to claim 1, wherein
   the controller totalizes degrees of battery deterioration relative to durable years of the battery, wherein the degrees of battery deterioration are estimated from respective history of the battery environment data, power consumption data concerning electrical components, and vehicle running data organized by vehicle characteristic data and recorded in the recording unit, respectively, based on the data concerning battery deterioration.

4. A powertrain battery life predicting apparatus according to claim 1, further comprising an input unit in which a driver of the vehicle enters information on assumed vehicle running, wherein
   the controller estimates the degree of battery deterioration from data recorded based on the data concerning battery deterioration in the recording unit and the information on assumed vehicle running entered in the input unit.

5. A powertrain having the powertrain battery life predicting apparatus according to claim 1 installed in an operating section.

6. A powertrain battery life warning apparatus comprising:
   a data processing unit for obtaining and processing data on a vehicle in which a battery is installed as a power source of the vehicle, the data consisting of battery environment data, power consumption data concerning electrical components, and vehicle running data;
   a recording unit for recording vehicle characteristic data and histories of the data obtained and processed;
   wherein the battery environment data includes a temperature, the vehicle characteristic data includes a vehicle weight, and the vehicle running data includes a vehicle running distance;
   a storage for storing data concerning battery deterioration obtained in a vehicle running test;
   a controller for estimating a degree of battery deterioration relative to durable years of the battery from the vehicle characteristic data and the histories of the data recorded based on the data concerning battery deterioration in the recording unit, predicting a timing of replacing the battery, and determining a level of warning; and
   a display for visually showing information on the level of warning.

7. A powertrain battery life warning apparatus according to claim 6, wherein
   the controller determines a driving pattern of the vehicle from the vehicle running data recorded in the recording unit and estimates a degree of battery deterioration relative to durable years of the battery based on the data concerning battery deterioration in the determined driving pattern stored in the storage.

8. A powertrain battery life warning apparatus according to claim 6, wherein
   the controller totalizes degrees of battery deterioration relative to durable years of the battery, wherein the degrees of battery deterioration are estimated from respective history of the battery environment data, power consumption data concerning electrical components, and vehicle running data organized by vehicle characteristic data and recorded in the recording unit, respectively, based on the data concerning battery deterioration.

9. A powertrain battery life warning apparatus according to claim 6, further comprising an input unit in which a driver of the vehicle enters information on assumed vehicle running, wherein
   the controller estimates the degree of battery deterioration from the data recorded based on the data concerning battery deterioration in the recording unit and the information on assumed vehicle running entered in the input unit.

10. A powertrain having the powertrain battery life warning apparatus according to claim 6 installed in an operating section.

* * * * *